US008276051B2

(12) United States Patent
Weingarten et al.

(10) Patent No.: US 8,276,051 B2
(45) Date of Patent: Sep. 25, 2012

(54) CHIEN-SEARCH SYSTEM EMPLOYING A CLOCK-GATING SCHEME TO SAVE POWER FOR ERROR CORRECTION DECODER AND OTHER APPLICATIONS

(75) Inventors: Hanan Weingarten, Herzelia (IL); Eli Sterin, Yoqneam (IL); Ofir Avraham Kanter, Yoqneam (IL)

(73) Assignee: Densbits Technologies Ltd., Haifa (IL)

( * ) Notice: Subject to any disclaimer, the term of this patent is extended or adjusted under 35 U.S.C. 154(b) by 384 days.

(21) Appl. No.: 12/595,640

(22) PCT Filed: Sep. 17, 2008

(86) PCT No.: PCT/IL2008/001235
§ 371 (c)(1),
(2), (4) Date: Oct. 13, 2009

(87) PCT Pub. No.: WO2009/074979
PCT Pub. Date: Jun. 18, 2009

(65) Prior Publication Data
US 2010/0058146 A1    Mar. 4, 2010

Related U.S. Application Data

(60) Provisional application No. 60/996,948, filed on Dec. 12, 2007, provisional application No. 61/071,468, filed on Apr. 30, 2008, provisional application No. 61/071,487, filed on May 1, 2008.

(51) Int. Cl.
*H03M 13/00* (2006.01)
(52) U.S. Cl. ........................................ 714/781; 714/784
(58) Field of Classification Search .................. 714/781, 714/784
See application file for complete search history.

(56) References Cited

U.S. PATENT DOCUMENTS

| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 4,998,010 A | 3/1991 | Chandler et al. |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |
| 5,905,740 A | 5/1999 | Williamson |
| 5,926,409 A | 7/1999 | Engh et al. |
| 5,956,268 A | 9/1999 | Lee |

(Continued)

OTHER PUBLICATIONS

International Search Report for International Application No. PCT/IL08/01235 mailed Jan. 28, 2009.

(Continued)

*Primary Examiner* — Charles Ehne
(74) *Attorney, Agent, or Firm* — SNR Denton US LLP

(57) ABSTRACT

Chien search apparatus operative to evaluate an error locator polynomial having a known rank and including a sequence of terms for each element in a finite field whose elements correspond respectively to bits in each of a stream of data blocks to be decoded, the apparatus comprising a sequence of functional units each operative to compute a corresponding term in the sequence of terms included in the error locator polynomial, each term having a degree; and a power saving unit operative to de-activate at least one individual functional unit from among the sequence of functional units, the individual functional unit being operative, when active, to compute a term whose degree exceeds the rank.

18 Claims, 9 Drawing Sheets

U.S. PATENT DOCUMENTS

| | | | |
|---|---|---|---|
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,119,262 A | 9/2000 | Chang et al. | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,279,137 B1 * | 8/2001 | Poeppelman et al. | 714/781 |
| 6,301,151 B1 | 10/2001 | Engh et al. | |
| 6,370,061 B1 | 4/2002 | Yachareni et al. | |
| 6,374,383 B1 | 4/2002 | Weng | |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |
| 6,560,747 B1 | 5/2003 | Weng | |
| 6,637,002 B1 | 10/2003 | Weng et al. | |
| 6,639,865 B2 | 10/2003 | Kwon | |
| 6,674,665 B1 | 1/2004 | Mann et al. | |
| 6,704,902 B1 | 3/2004 | Shinbashi et al. | |
| 6,751,766 B2 | 6/2004 | Guterman et al. | |
| 6,772,274 B1 | 8/2004 | Estakhri | |
| 6,781,910 B2 | 8/2004 | Smith | |
| 6,792,569 B2 | 9/2004 | Cox et al. | |
| 6,873,543 B2 | 3/2005 | Smith et al. | |
| 6,891,768 B2 | 5/2005 | Smith et al. | |
| 6,914,809 B2 | 7/2005 | Hilton et al. | |
| 6,915,477 B2 | 7/2005 | Gollamudi et al. | |
| 6,952,365 B2 | 10/2005 | Gonzalez et al. | |
| 6,961,890 B2 | 11/2005 | Smith | |
| 6,990,012 B2 | 1/2006 | Smith et al. | |
| 6,996,004 B1 | 2/2006 | Fastow et al. | |
| 6,999,854 B2 | 2/2006 | Roth | |
| 7,010,739 B1 | 3/2006 | Feng et al. | |
| 7,012,835 B2 | 3/2006 | Gonzalez et al. | |
| 7,038,950 B1 | 5/2006 | Hamilton et al. | |
| 7,068,539 B2 | 6/2006 | Guterman et al. | |
| 7,079,436 B2 | 7/2006 | Perner et al. | |
| 7,149,950 B2 | 12/2006 | Spencer et al. | |
| 7,177,977 B2 | 2/2007 | Chen et al. | |
| 7,191,379 B2 | 3/2007 | Adelmann et al. | |
| 7,196,946 B2 | 3/2007 | Chen et al. | |
| 7,203,874 B2 | 4/2007 | Roohparvar | |
| 7,290,203 B2 | 10/2007 | Emma et al. | |
| 7,292,365 B2 | 11/2007 | Knox | |
| 7,301,928 B2 | 11/2007 | Nakabayashi et al. | |
| 7,441,067 B2 | 10/2008 | Gorobets et al. | |
| 7,466,575 B2 | 12/2008 | Shalvi et al. | |
| 7,533,328 B2 | 5/2009 | Alrod et al. | |
| 7,558,109 B2 | 7/2009 | Brandman et al. | |
| 7,593,263 B2 | 9/2009 | Sokolov et al. | |
| 7,697,326 B2 | 4/2010 | Sommer et al. | |
| 7,706,182 B2 | 4/2010 | Shalvi et al. | |
| 7,716,562 B1 * | 5/2010 | Wu et al. | 714/784 |
| 7,804,718 B2 | 9/2010 | Kim | |
| 7,805,663 B2 | 9/2010 | Brandman et al. | |
| 7,805,664 B1 | 9/2010 | Yang et al. | |
| 7,844,877 B2 | 11/2010 | Litsyn et al. | |
| 7,961,797 B1 | 6/2011 | Yang et al. | |
| 8,020,073 B2 | 9/2011 | Emma et al. | |
| 8,122,328 B2 | 2/2012 | Liu et al. | |
| 2002/0063774 A1 | 5/2002 | Hillis et al. | |
| 2002/0085419 A1 | 7/2002 | Kwon et al. | |
| 2002/0154769 A1 | 10/2002 | Petersen et al. | |
| 2003/0065876 A1 | 4/2003 | Lasser | |
| 2003/0101404 A1 | 5/2003 | Zhao et al. | |
| 2003/0101406 A1 * | 5/2003 | Song | 714/774 |
| 2003/0105620 A1 | 6/2003 | Bowen | |
| 2003/0192007 A1 | 10/2003 | Miller et al. | |
| 2004/0015771 A1 | 1/2004 | Lasser et al. | |
| 2004/0030971 A1 | 2/2004 | Tanaka et al. | |
| 2004/0153722 A1 | 8/2004 | Lee | |
| 2004/0153817 A1 | 8/2004 | Norman et al. | |
| 2004/0181735 A1 | 9/2004 | Xin | |
| 2005/0013165 A1 | 1/2005 | Ban | |
| 2005/0018482 A1 | 1/2005 | Cemea et al. | |
| 2005/0083735 A1 | 4/2005 | Chen et al. | |
| 2005/0117401 A1 | 6/2005 | Chen et al. | |
| 2005/0120265 A1 | 6/2005 | Pline et al. | |
| 2005/0128811 A1 | 6/2005 | Kato et al. | |
| 2005/0138533 A1 | 6/2005 | Le-Bars et al. | |
| 2005/0144213 A1 | 6/2005 | Simkins et al. | |
| 2005/0144368 A1 | 6/2005 | Chung et al. | |
| 2005/0169057 A1 | 8/2005 | Shibata et al. | |
| 2005/0172179 A1 | 8/2005 | Brandenberger et al. | |
| 2005/0210353 A1 * | 9/2005 | Dohmen et al. | 714/746 |
| 2005/0213393 A1 | 9/2005 | Lasser | |
| 2006/0059406 A1 | 3/2006 | Micheloni et al. | |
| 2006/0059409 A1 | 3/2006 | Lee | |
| 2006/0064537 A1 | 3/2006 | Oshima et al. | |
| 2006/0101193 A1 | 5/2006 | Murin | |
| 2006/0203587 A1 | 9/2006 | Li et al. | |
| 2006/0221692 A1 | 10/2006 | Chen | |
| 2006/0248434 A1 | 11/2006 | Radke et al. | |
| 2006/0268608 A1 | 11/2006 | Noguchi et al. | |
| 2006/0294312 A1 | 12/2006 | Walmsley | |
| 2007/0025157 A1 | 2/2007 | Wan et al. | |
| 2007/0063180 A1 | 3/2007 | Asano et al. | |
| 2007/0103992 A1 | 5/2007 | Sakui et al. | |
| 2007/0104004 A1 | 5/2007 | So et al. | |
| 2007/0109858 A1 | 5/2007 | Conley et al. | |
| 2007/0124652 A1 | 5/2007 | Litsyn et al. | |
| 2007/0143561 A1 | 6/2007 | Gorobets | |
| 2007/0150694 A1 | 6/2007 | Chang et al. | |
| 2007/0168625 A1 | 7/2007 | Cornwell et al. | |
| 2007/0171714 A1 | 7/2007 | Wu et al. | |
| 2007/0171730 A1 | 7/2007 | Ramamoorthy et al. | |
| 2007/0180346 A1 | 8/2007 | Murin | |
| 2007/0223277 A1 | 9/2007 | Tanaka et al. | |
| 2007/0226582 A1 | 9/2007 | Tang et al. | |
| 2007/0226592 A1 | 9/2007 | Radke | |
| 2007/0228449 A1 | 10/2007 | Takano et al. | |
| 2007/0253249 A1 | 11/2007 | Kang et al. | |
| 2007/0253250 A1 | 11/2007 | Shibata et al. | |
| 2007/0263439 A1 | 11/2007 | Cornwell et al. | |
| 2007/0266291 A1 | 11/2007 | Toda et al. | |
| 2007/0271494 A1 | 11/2007 | Gorobets | |
| 2008/0010581 A1 | 1/2008 | Alrod et al. | |
| 2008/0028014 A1 | 1/2008 | Hilt et al. | |
| 2008/0055989 A1 | 3/2008 | Lee et al. | |
| 2008/0082897 A1 | 4/2008 | Brandman et al. | |
| 2008/0092026 A1 | 4/2008 | Brandman et al. | |
| 2008/0104309 A1 | 5/2008 | Cheon et al. | |
| 2008/0116509 A1 | 5/2008 | Harari et al. | |
| 2008/0126686 A1 | 5/2008 | Sokolov et al. | |
| 2008/0127104 A1 | 5/2008 | Li et al. | |
| 2008/0128790 A1 | 6/2008 | Jung | |
| 2008/0130341 A1 | 6/2008 | Shalvi et al. | |
| 2008/0137413 A1 | 6/2008 | Kong et al. | |
| 2008/0148115 A1 | 6/2008 | Sokolov et al. | |
| 2008/0158958 A1 | 7/2008 | Shalvi et al. | |
| 2008/0159059 A1 | 7/2008 | Moyer | |
| 2008/0162079 A1 | 7/2008 | Astigarraga et al. | |
| 2008/0168216 A1 | 7/2008 | Lee | |
| 2008/0168320 A1 | 7/2008 | Cassuto et al. | |
| 2008/0181001 A1 | 7/2008 | Shalvi | |
| 2008/0198650 A1 | 8/2008 | Shalvi et al. | |
| 2008/0198652 A1 | 8/2008 | Shalvi et al. | |
| 2008/0219050 A1 | 9/2008 | Shalvi et al. | |
| 2008/0225599 A1 | 9/2008 | Chae | |
| 2008/0263262 A1 | 10/2008 | Sokolov et al. | |
| 2008/0282106 A1 | 11/2008 | Shalvi et al. | |
| 2008/0285351 A1 | 11/2008 | Shlick et al. | |
| 2008/0301532 A1 | 12/2008 | Uchikawa et al. | |
| 2009/0024905 A1 | 1/2009 | Shalvi et al. | |
| 2009/0043951 A1 | 2/2009 | Shalvi et al. | |
| 2009/0072303 A9 | 3/2009 | Prall et al. | |
| 2009/0091979 A1 | 4/2009 | Shalvi | |
| 2009/0103358 A1 | 4/2009 | Sommer et al. | |
| 2009/0106485 A1 | 4/2009 | Anholt | |
| 2009/0113275 A1 | 4/2009 | Chen et al. | |

| | | |
|---|---|---|
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol: 2, pp: II-369-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirneno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC STANDARD, "Stress-Test-Driven Qualification of Integrated Circuits", Jedec Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

| Notation | description |
|---|---|
| $E_{old-total}$ | Total power dissipated traditional scheme. |
| $E_{new-total}$ | Total power dissipated after the implementation of the proposed scheme. |
| $E_{tap-clk-data}$ | Power drawn by each tap (1 register 1 multiplier and 1 constant) when clk and data allowed to switch. |
| $E_{tap-clk}$ | Power drawn by each tap (1 register 1 multiplier and 1 constant) when only clk toggles but the data remains constant 0. |
| $V_{thr}$ | The chosen threshold, this parameter is specific to application and need be chosen with error probability in mind. |
| $P_{vthr}$ | Probability that actual number of errors is less then $V_{thr}$. |
| j | Actual number of errors |
| J | Maximum error correction capability of the code. |

FIG. 7

| Notation | Description |
|---|---|
| n | Number of clk domains |
| J | Maximum error correcting capability, also number of taps in the Chien-Search. |
| $l_1, l_2, \ldots l_n$ | Clk gating partition scheme, i.e. $l_1$ first taps connected to clk_1, $l_2-l_1$ next taps connected to clk_2, $l_n-l_{n-1}$ last taps connected to clk_n, off course $l_n=t$. |
| $P_i$ | Probability that number of errors equal to i. |
| $E_{tap\text{-}clk\text{-}data}$ | Power drawn by each tap when clk and data allowed to switch, i.e. where the ELP coefficient of this tap is not zero. |
| $E_{tap\text{-}clk}$ | Power drawn by each tap when only clk toggles but the data remains constant 0. |
| E(i, j) | $E(i, j) = [i^* E_{tap\text{-}clk\text{-}data} + (j-i)^* E_{tap\text{-}clk}]$ i.e. power drawn by a set of j taps, where i taps have coefficients different than zero. |
| $E_{total}$ | Total power drawn by the Chien-Search circuit. |

FIG. 9

CHIEN-SEARCH SYSTEM EMPLOYING A CLOCK-GATING SCHEME TO SAVE POWER FOR ERROR CORRECTION DECODER AND OTHER APPLICATIONS

CROSS-REFERENCE TO CO PENDING RELATED APPLICATIONS

This application is a National Phase Application of PCT International Application No. PCT/IL2008/001235, entitled "CHIEN-SEARCH SYSTEM EMPLOYING A CLOCK-GATING SCHEME TO SAVE POWER FOR ERROR CORRECTION DECODER AND OTHER APPLICATIONS", International Filing Date Sep. 17, 2008, published on Jun. 18, 2009 as International Publication No. WO 2009/074979, which in turn claims priority from U.S. Provisional Patent Application No. 60/996,948, filed Dec. 12, 2007, U.S. Provisional Patent Application No. 61/071,468, filed Apr. 30, 2008 and U.S. Provisional Patent Application No. 61/071,487 filed May 1, 2008, all of which are incorporated herein by reference in their entirety.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,782, filed Dec. 5, 2007 and entitled "Systems and Methods for Using a Training Sequence in Flash Memory", U.S. Provisional Application No. 61/064,853, filed Mar. 31, 2008 and entitled "Flash Memory Device with Physical Cell Value Deterioration Accommodation and Methods Useful in Conjunction Therewith", U.S. Provisional Application No. 61/129,608, filed Jul. 8, 2008 and entitled "A Method for Acquiring and Tracking Detection Thresholds in Flash Devices", U.S. Provisional Application No. 61/006,806, filed Jan. 31, 2008 and entitled "Systems and Methods for using a Erasure Coding in Flash memory", U.S. Provisional Application No. 61/071,486, filed May 1, 2008 and entitled "Systems and Methods for Handling Immediate Data Errors in Flash Memory", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/006,805, filed Jan. 31, 2008 and entitled "A Method for Extending the Life of Flash Devices", U.S. Provisional Application No. 61/071,465, filed Apr. 30, 2008 and entitled "Systems and Methods for Temporarily Retiring Memory Portions", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to Chien searches and more particularly to Chien search algorithms in error correction decoders.

BACKGROUND OF THE INVENTION

Conventional flash memory technology and related technologies are described in the following publications inter alia:
[1] Paulo Cappelletti, Clara Golla, Piero Olivo, Enrico Zanoni, "Flash Memories", Kluwer Academic Publishers, 1999
[2] G. Campardo, R. Micheloni, D. Novosel, "CLSI-Design of Non-Volatile Memories", Springer Berlin Heidelberg New York, 2005
[3] "Error Correction Coding Mathematical Methods and Algorithms", Todd K. Moon, John Wiley & Sons, Inc., 2005.
[4] "Introduction to Coding Theory", Ron M. Roth, Cambridge University Press, 2006.
[5] "Algebraic Codes for Data Transmission", Richard E. Blahut, Cambridge University Press, 2003.
[6] "Introduction to Error Correcting Codes", Michael Purser, Artech House Inc. 1995.

The disclosures of all publications and patent documents mentioned in the specification, and of the publications and patent documents cited therein directly or indirectly, are hereby incorporated by reference.

SUMMARY OF THE INVENTION

Certain embodiments of the present invention seek to provide an array of taps which performs a low power Chien search, the array typically including a number of taps which depends on the rank of the error locator polynomial currently subject of the Chien search.

Certain embodiments of the present invention seek to provide an error correction decoder including an array of taps which performs a low power Chien search, the array typically including a number of taps that typically depends on the maximum error correction capability of the error correction code, wherein the decoder includes control apparatus allowing a subset of taps to be used which depends on the rank of the error locator polynomial currently subject of the Chien search.

There is thus provided, in accordance with at least one embodiment of the present invention, Chien search apparatus operative to evaluate an error locator polynomial having a known rank and including a sequence of terms for each element in a finite field whose elements correspond respectively to bits in each of a stream of data blocks to be decoded, the apparatus comprising a sequence of functional units each operative to compute a corresponding term in the sequence of terms included in the error locator polynomial, each term having a degree; and a power saving unit operative to de-activate at least one individual functional unit from among the sequence of functional units, the individual functional unit being operative, when active, to compute a term whose degree exceeds the rank.

Further in accordance with at least one embodiment of the present invention, the apparatus also comprises clocks associated with the sequence of functional units and wherein the power saving unit comprises a clock gating unit controlling the clocks.

Still further in accordance with at least one embodiment of the present invention, the power saving unit comprises power saving logic operative to selectively deactivate any of a group of subsets of the functional units, the group comprising at least one predetermined subset of the plurality of functional units.

Additionally in accordance with at least one embodiment of the present invention, the power saving logic is operative to selectively deactivate an individual subset of functional units within the group of subsets, if all functional units in the individual subset are operative to compute terms whose degree exceeds the rank.

Further in accordance with at least one embodiment of the present invention, the group of subsets comprises at least one predetermined nested subset of the sequence of functional units, each predetermined nested subset including a sequence of functional units terminating in the functional unit in the sequence of functional units which has the highest degree.

Also provided, in accordance with at least one embodiment of the present invention, is a Chien search method operative to evaluate an error locator polynomial having a known rank and including a sequence of terms for each element in a finite field whose elements correspond respectively to bits in each of a stream of data blocks to be decoded, the method comprising providing a sequence of functional units each operative to compute a corresponding term in the error locator polynomial, each term having a degree; and de-activating at least one individual functional unit from among the sequence of functional units, the individual functional unit being operative, when active, to compute a term whose degree exceeds the rank.

Further in accordance with at least one embodiment of the present invention, a histogram of the number of errors per data block in the stream is known, and the method also comprises designing power saving logic operative to effect the de-activating, including selecting, for each predetermined subset, a cut-off point in the sequence of functional units above which all functional units belong to the predetermined subset, wherein the cut-off point is selected to maximize power saving achieved by the de-activating, given the histogram.

Additionally in accordance with at least one embodiment of the present invention, the data blocks are BCH-encoded.

Further in accordance with at least one embodiment of the present invention, the data blocks are Reed-Solomon-encoded.

Additionally in accordance with at least one embodiment of the present invention, the data blocks are stored in a flash memory device.

Additionally in accordance with at least one embodiment of the present invention, the apparatus also comprises an error locator polynomial generator operative to generate the error locator polynomial and output its rank to the power saving unit.

Further in accordance with at least one embodiment of the present invention, the clock gating unit defines a plurality of clock domains, wherein each of the sequence of functional units belongs to at least one of the clock domains.

The error locator polynomial generator may be operative in accordance with any suitable methodology such as but not limited to the Berlekamp-Massey algorithm or the Patterson algorithm.

A particular feature of certain embodiments of the present invention is that registers can be controlled, in groups predefined at the design stage to include one or more registers sharing a single clock, by gating or not gating the group clock.

A particular feature of certain embodiments of the present invention is that error information is used to determine power consumption.

A particular feature of certain embodiments of the present invention is that error information is used to determine sub group clock source shut down.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

A detailed description of embodiments referred to above, and other embodiments, will follow.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

BRIEF DESCRIPTION OF THE DRAWINGS

Certain embodiments of the present invention are illustrated in the following drawings:

FIG. 7 is a first table describing notation used in first portions of the following description;

FIG. 9 is a second table describing notation used in second portions of the following description.

DETAILED DESCRIPTION OF CERTAIN EMBODIMENTS

Figure 1A:
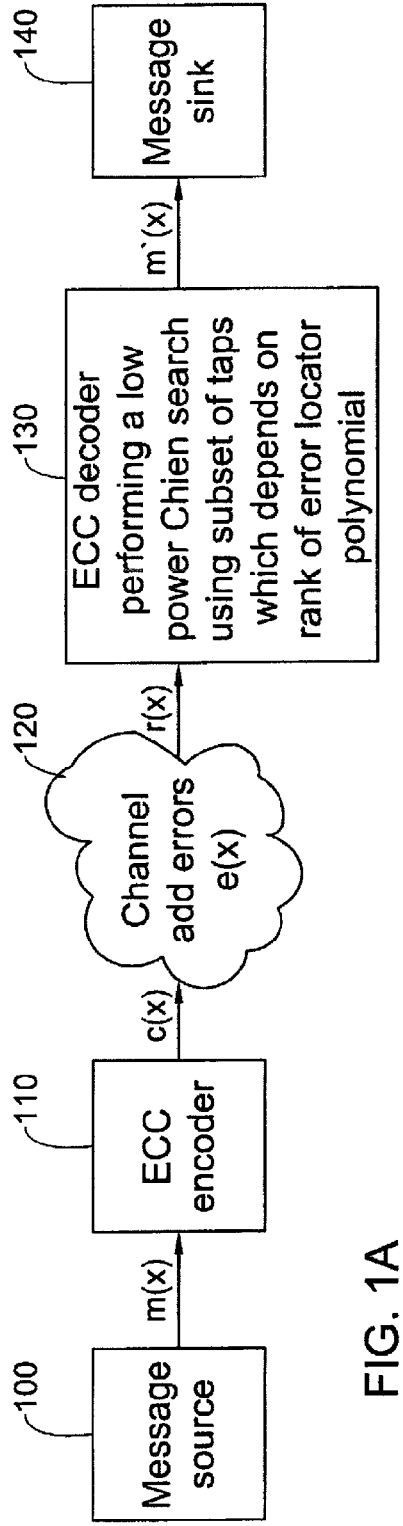
FIG. 1A is a simplified functional block diagram illustration of a communication system which performs a low power Chien search using a subset of taps which depend on the rank of the error locator polynomial of the Chien search, all in accordance with certain embodiments of the present invention.

FIG. 1A is a simplified functional block diagram illustration of an encoder-decoder system which performs a low power Chien search using a subset of taps which depends on the rank of the error locator polynomial of the Chien search, all in accordance with certain embodiments of the present invention. It is appreciated however that the applicability of the present invention includes all possible applications of Chien searches and is not limited to error correction decoders.

BCH and RS (Reed-Solomon) are among the most widely used cyclic error correcting codes. They are used in many various practical fields such as storage and communication.

Moreover, when these coding schemes are used in mobile applications, power consumption is a major design constraint which might affect the viability of the usage of these schemes in the aforementioned applications.

As shown in FIG. 1A, the theory of Error Correction Coding (ECC) comprises computing and adding a redundancy to the message m(x) which it is desired to transmit or store, making it into a codeword c(x) of some known codebook. The channel or medium through which the message is conveyed from transmitter to receiver or to the storage medium, adds errors e(x) to the codeword c(x), i.e. r(x)=c(x)+e(x) where r(x) is the received data. Errors may for example stem from various physical processes such as thermal noise, deterioration of storage medium over time and, after many read/write operations, inaccuracies in the transmitter or receiver hardware. The receiver, using the redundancy that was added to the message and the known codebook, is able to reconstruct the original message m'(x) and convey it to the intended target i.e. the message sink.

The BCH and RS codes are conventional cyclic error correction codes. The encoder for BCH and RS codes can be described in terms of a generation matrix G, thus the encoding process comprises a matrix multiplication c=mG, where c is the transmitted codeword and m is the message to be transmitted.

The decoding of BCH/RS codes comprises syndrome decoding, i.e. there exists a parity check matrix H which has the following property: $GH^T=0$. It follows that $cH^T=mGH^T=0$.

The received vector r comprises the transmitted codeword c and the errors added in the channel i.e. r=c+e. The receiver computes the syndrome vector s using the parity check matrix i.e. $s=rH^T=cH^T+eH^T=mGH^T+eH^T=0+eH^T=eH^T$, or in short $s=eH^T$.

The construction of BCH and RS codes and the special form of the parity check matrix H are known. Due to the special form of the BCH and RS codes and the matrix H the set of equations $s=eH^T$ can be solved directly by exhaustive search in the decoder thereby to find the error vector e and correctly decode the received message. Since exhaustive search is a computationally unattractive way to implement the decoder, the problem is solved by introducing an Error Locator Polynomial (ELP) whose roots are the reciprocals of the error locations. Several algorithms exist to derive the error locator polynomial from the syndromes, such as Berlekamp-Massey and the Euclidean algorithms, e.g. as described in "Error Correction Coding Mathematical Methods and Algorithms", Todd K. Moon, John Wiley & Sons, Inc., 2005. The error locator polynomial can be written as follows, where j (or v) denotes the number of errors in the received vector:

$$\Lambda(x)=\Lambda_0+\Lambda_1 x+\Lambda_2 x^2+\Lambda_j x^j$$

In the general case j can be equal to J (or t) which denotes the maximum number of errors the algorithm is designed to correct.

Once the decoder computes the error locator polynomial, all is left for the decoder to do is to evaluate the error locator polynomial for all the elements of the field; the ones that zero the error locator polynomial are the error locations.

Figure 1B:
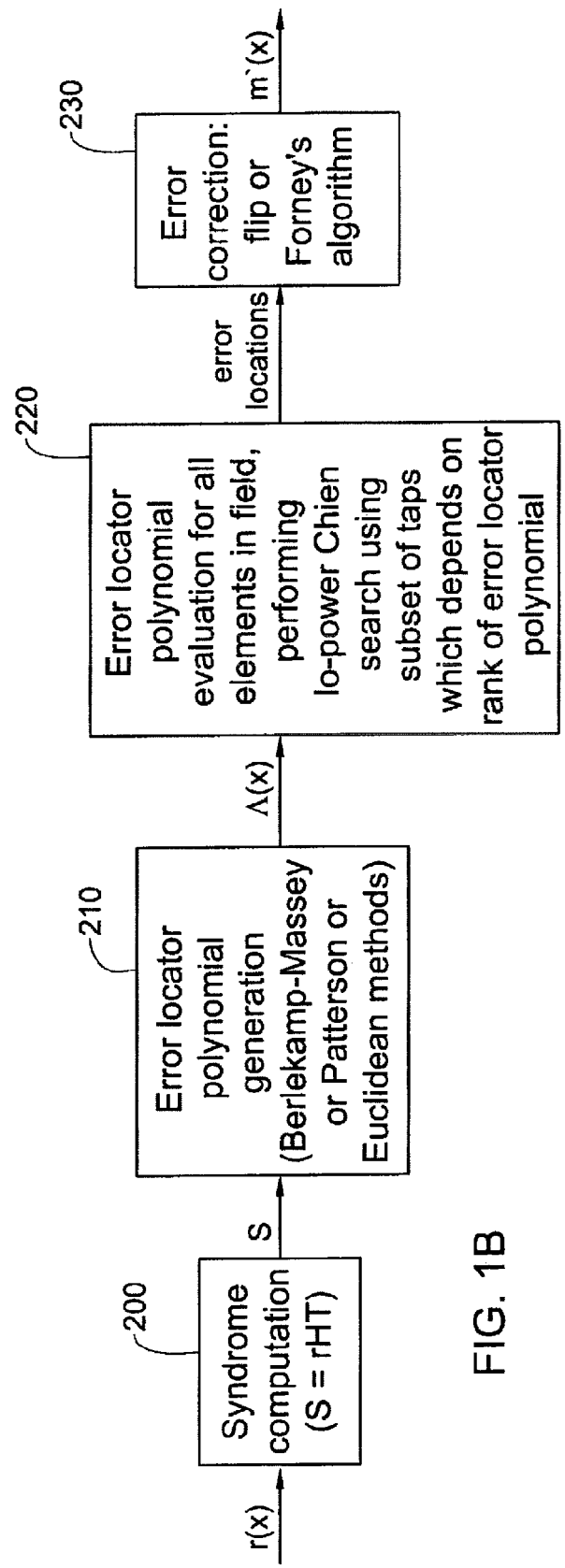
FIG. 1B is a simplified functional block diagram illustration of the Chien search performing ECC decoder of FIG. 1A, constructed and operative in accordance with certain embodiments of the present invention which may be based on BCH or Reed-Solomon algorithms.

FIG. 1B is a simplified functional block diagram illustration of the ECC decoder of FIG. 1A, constructed and operative in accordance with certain embodiments of the present invention.

FIG. 1B depicts the decoding process of the BCH/RS decoder both for the binary BCH case and for the case of non-binary code, in which an additional functionality is provided (block 230): error value computation, e.g. based on Forney's algorithm.

Figure 2:
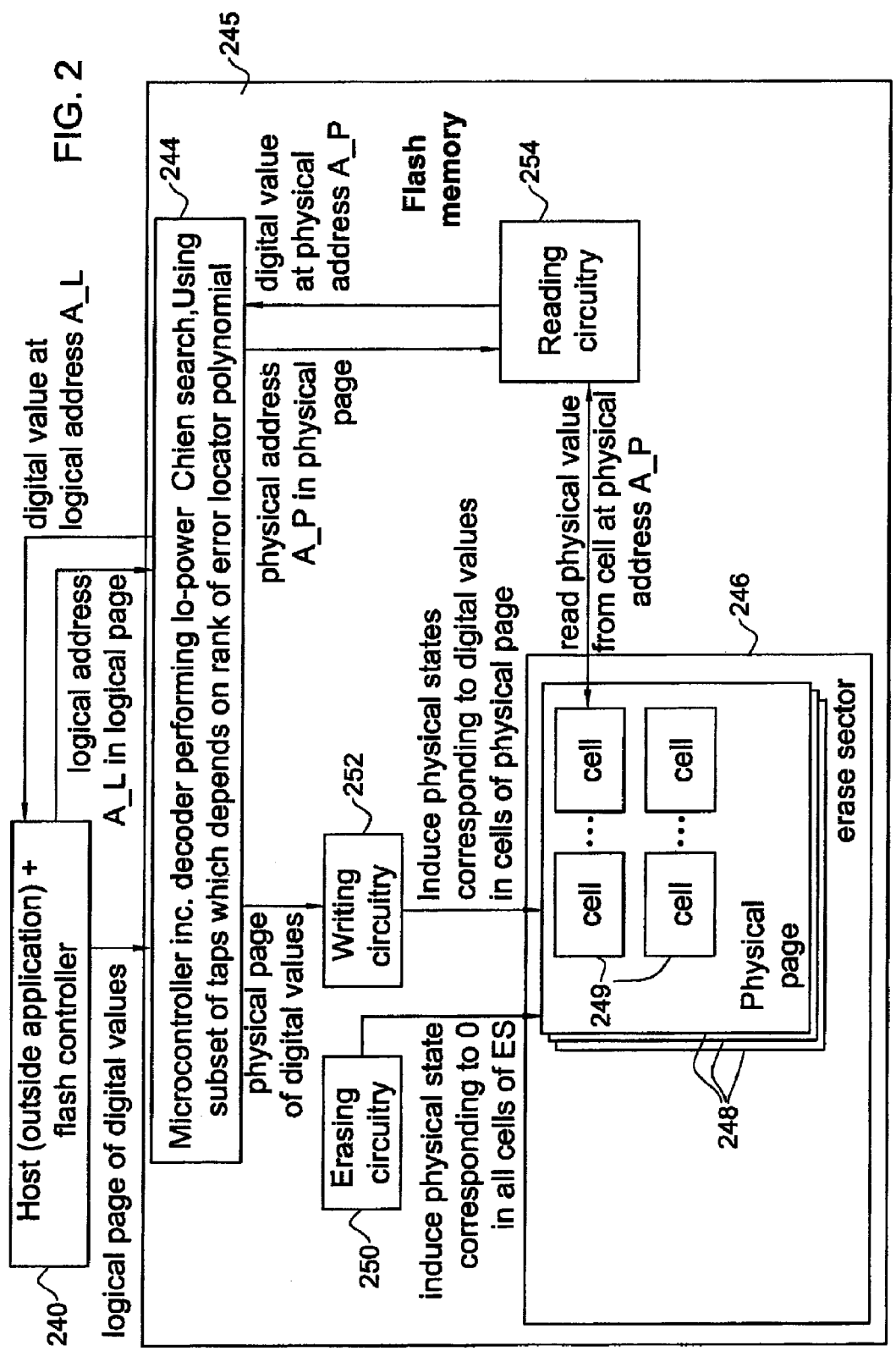
FIG. 2 is a simplified functional block diagram illustration of a flash memory system including an encoder-decoder functionality operative to perform a low power Chien search using a subset of taps which depends on the rank of the error locator polynomial of the Chien search, constructed and operative in accordance with certain embodiments of the present invention, wherein the functionality may reside in an internal microcontroller although alternatively the same functionality may reside in an external flash controller interfacing between a flash array and an external host.

The apparatus of FIGS. 1A and 1B have a wide variety of applications such as but not limited to flash memory applications e.g. as shown in FIG. 2.

Figure 3:
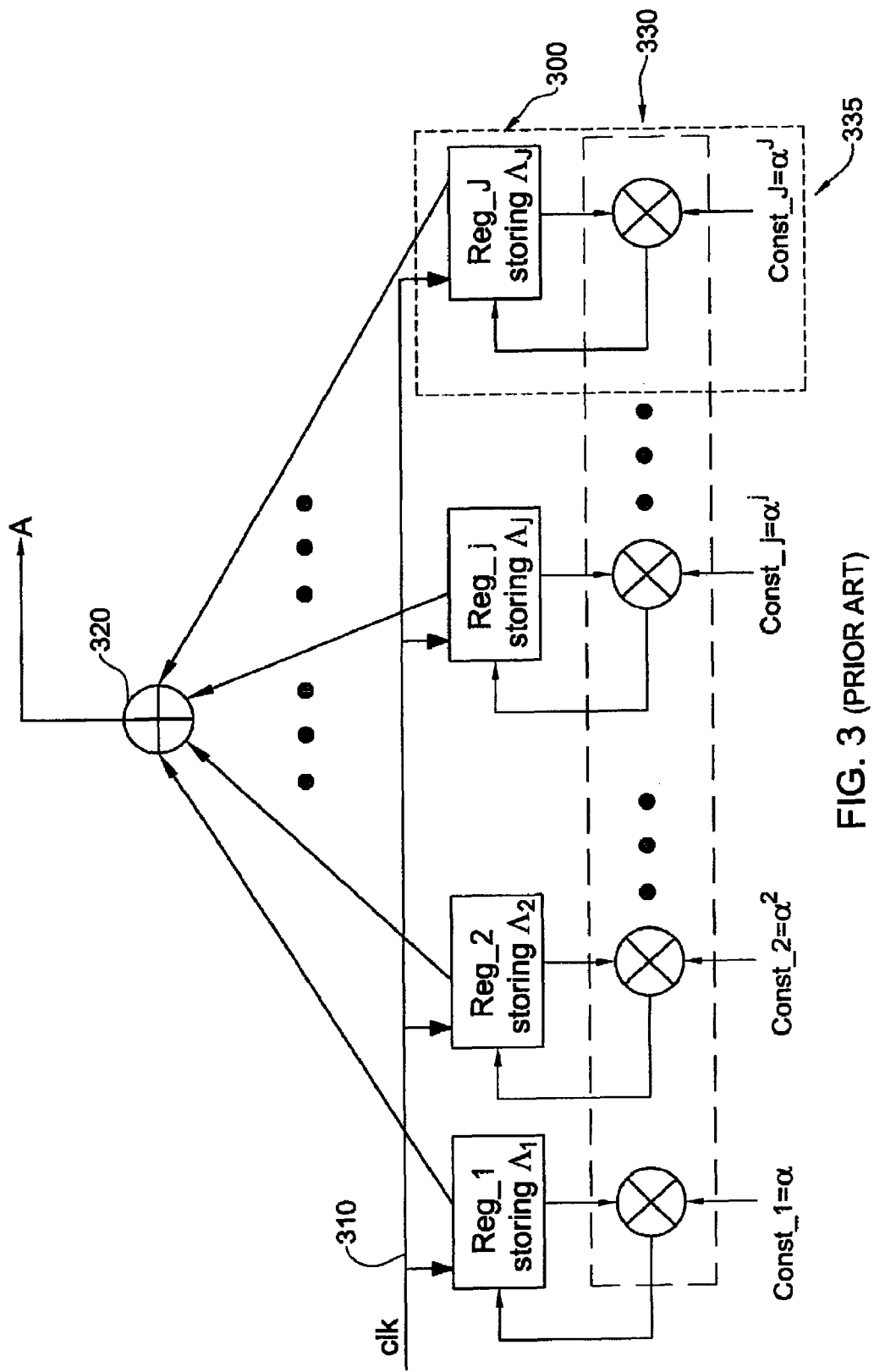
FIG. 3 is a simplified prior art functional block diagram illustration of a Chien search apparatus for error locator polynomial evaluation.

Reference is now made to FIG. 3 which is a simplified prior art functional block diagram illustration of apparatus for error locator polynomial evaluation. Error locator polynomial evaluation typically uses the Chien search algorithm. The computations are all done in the $GF(q^m)$ which is a finite field. Denoting a as a primitive element, it is well known that all the field elements can be generated from consecutive powers of $\alpha$ i.e. $\alpha^0, \alpha^1, \ldots, \alpha^{q^m}$. Error locator polynomial evaluation or the "Chien-Search" then comprises of finding all the roots of $\Lambda(x)$. x is evaluated for all powers of $\alpha$ i.e. x=1, $\alpha$, $\alpha^2$, $\alpha^3, \ldots, \alpha^{q^m}$. This can be achieved by the hardware depicted in FIG. 3 which includes an array of registers 300 and an array of multipliers 330 together defining J "taps" or "functional units" 335, each comprising a register and a multiplier.

In FIG. 3, Reg_1 to Reg_J are J registers which are initiated prior to the beginning of operation to hold $\Lambda\_1, \ldots, \Lambda\_J$ i.e. the coefficients of the error locator polynomial. J is the error correction capability of the designed code, whereas j is not a constant over multiple operations of the circuit, but rather varies and denotes the number of errors in the currently decoded data block. The clk signal in FIG. 3 denotes the clock signal that clocks the Reg_1 ... Reg_J registers. Const_1 ... Const_J in FIG. 3 are constants of successive powers of the primitive element in the field $\alpha$. The apparatus is shown in an initial state in which the registers Reg_1 to Reg_J store $\Lambda\_1$ to $\Lambda\_J$ respectively; subsequently, at each cycle, the registers are updated.

In each successive clock (clk signal) the contents of each register Reg_1 ... Reg_J is multiplied with a respective constant from among constants Const_1 ... Const_J and latched into a respective one of the registers Reg_1 ... Reg_J. Each register and associated multiplier forms a "tap" 335, as shown. An adder adds the partial sums of the error locator polynomial to produce sum A which is the evaluation of the error locator polynomial for $x=\alpha^n$ at the n'th clock cycle. If A equals $\Lambda_0$ at some clock n, this means, as described above, and as is well known in the art, that $\alpha^n$ is a root of the error locator polynomial. It follows that an error has occurred in bit n (for binary BCH codes) or in symbol n (for non-binary BCH or RS codes) of the received data. Having iterated over all elements in the field, and identified all errors, decoding is complete.

Figure 4:
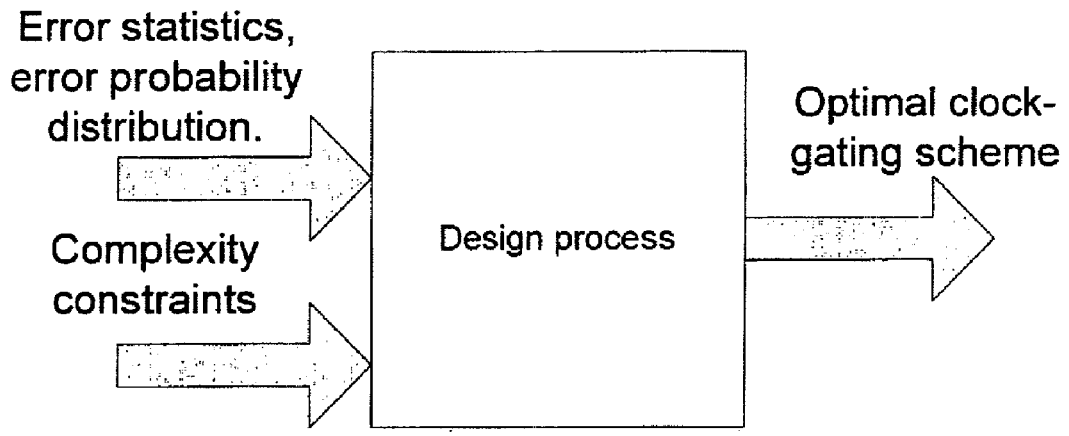
FIG. 4 is a diagram of a design process, constructed and operative in accordance with certain embodiments of the present invention, in which error information and optional complexity constraints are considerations in the design of a preferably optimal clock gating scheme.

In contrast, according to certain embodiments of the present invention, as shown in FIG. 4, a design process is provided in which a designer considers error probability information and complexity constraints such as the maximal number of clock domains, and designs a clock-gating scheme that takes advantage, preferably optimally, of the known number of errors during the decoding stage.

Figure 5:
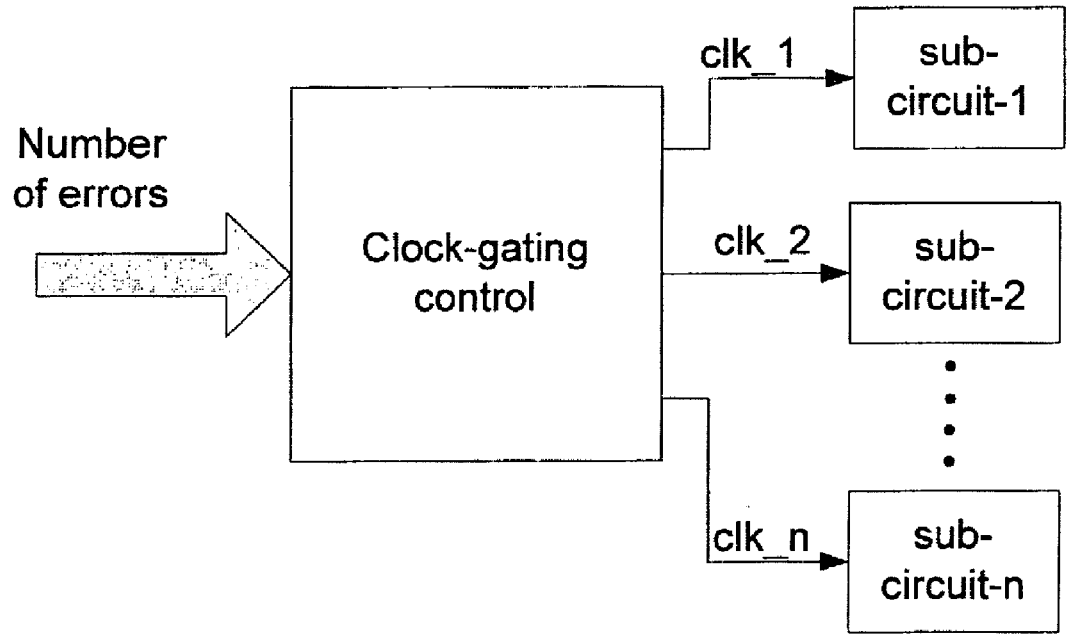
FIG. 5 is a diagram of a tap control scheme constructed and operative in accordance with certain embodiments of the present invention, in which the number of errors determines clock gating for each of two or more subgroups of taps useful in evaluating an error locator polynomial.

Also provided, according to certain embodiments of the present invention, is a clock-scheme associated with circuitry which takes advantage of the known number of errors to control which of several sub-circuits, also termed herein taps, are clocked and which have their clock gated, as depicted in FIG. 5.

EXAMPLE 59 taps are provided altogether. If 2 clock domains are provided, the clock gating unit is operative to deactivate, say, all taps from 20 to 59. The clock gating unit typically does so if the rank is known to be less than 20. If the rank is 20 or larger, the taps from 20 to 59 are active i.e. are not de-activated. Alternatively, 3 clock domains may be provided, such that all taps from (say) 10 to 59 may be de-activated, or alternatively, all taps from 20 to 59 may be de-activated, or alternatively, all taps may be active. These 3 options are used when the rank of the error locator polynomial is known to be smaller than 10, smaller than 20 but greater than 10, and greater than 20, respectively. The 3 clock domains therefore define 2 subsets of taps—the first including taps 10 to 19, or 10 to 59, in the sequence of taps, the second subset including taps 20 to 59. Another example would be having 3 clock domains, associated with taps 0-9, 10-20 and 21-59 respectively.

Figure 6A:
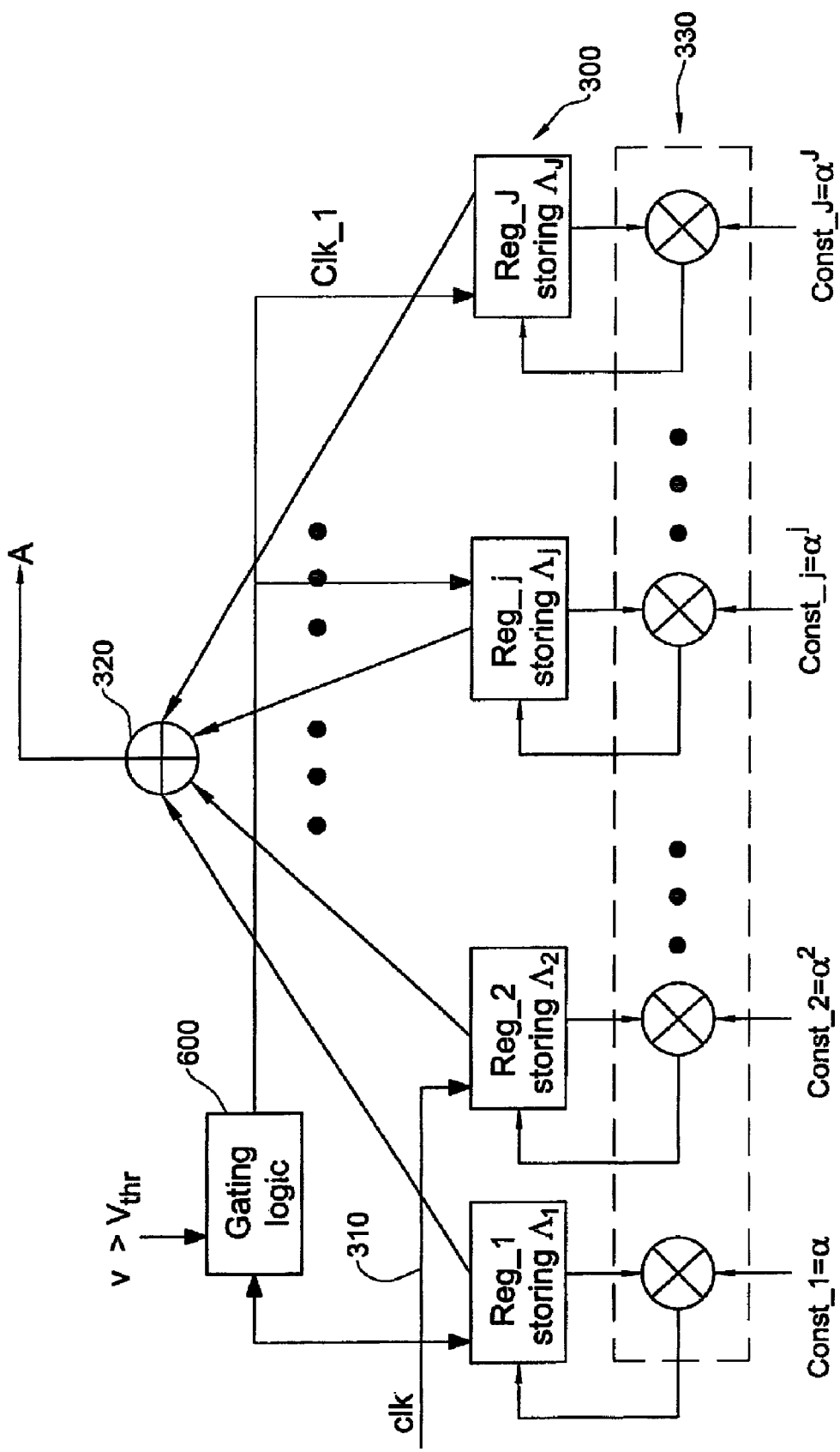
FIG. 6A is a simplified functional block diagram illustration of a first example of a tap control scheme constructed and operative in accordance with certain embodiments of the present invention.
Figure 6B:
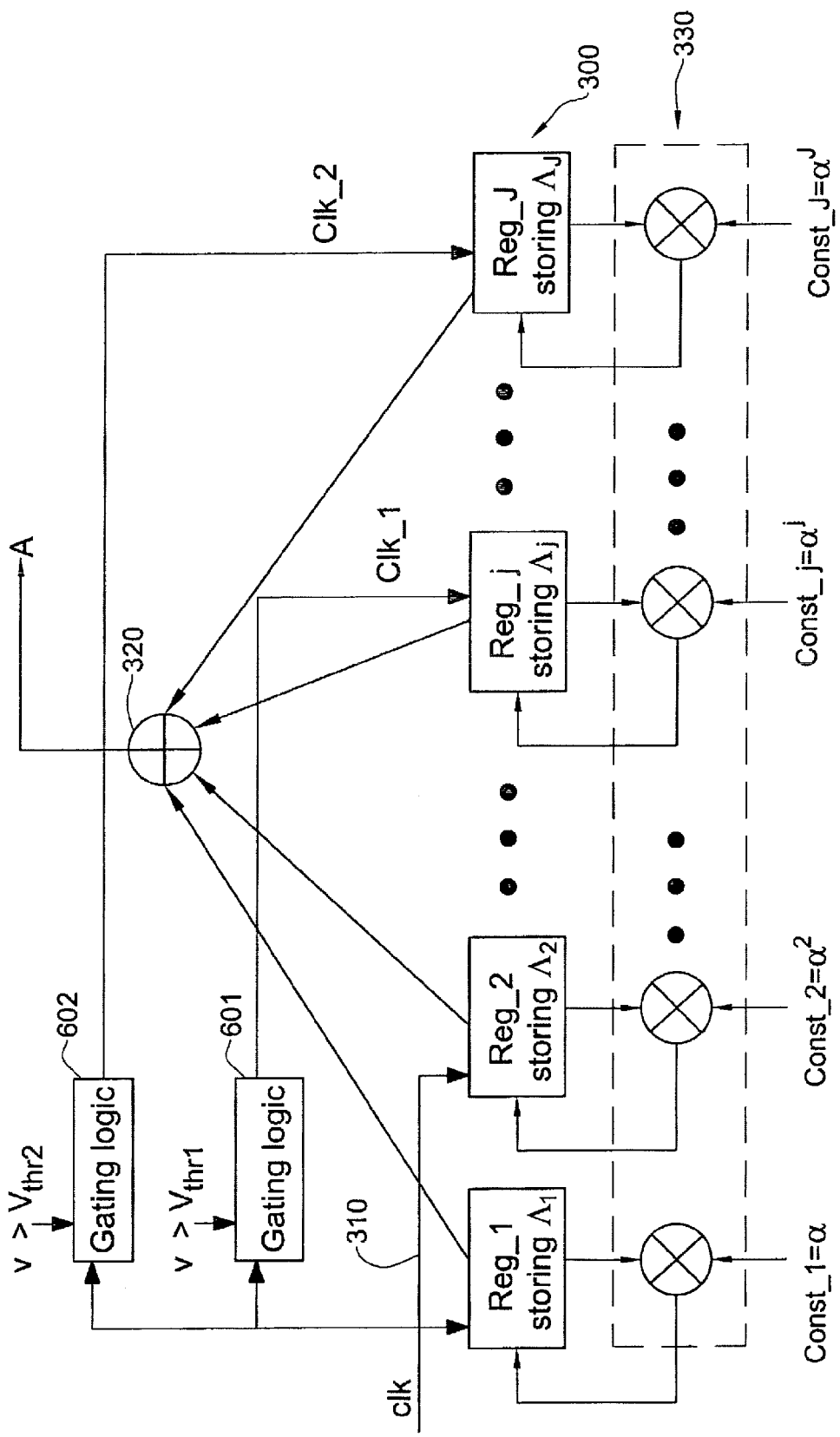
FIG. 6B is a simplified functional block diagram illustration of a second example of a tap control scheme constructed and operative in accordance with certain embodiments of the present invention.

FIGS. 6A-6B are simplified functional block diagram illustrations of two examples of Chien search apparatus constructed in accordance with the embodiments of FIGS. 4-5 which use a number of taps determined by the rank of the error locator polynomial.

As described above, j denotes the actual number of errors in the currently decoded data, which is also the rank of the error locator polynomial such that j is known at the time Chien-Search (CS) computation begins. J denotes the maximum error correcting capability of the constructed BCH/RS code.

The designed hardware includes J parallel "taps" as in FIG. 3, which include one register (from among Reg1 ... Reg_J) and one multiplier (from among Mul_1 ... Mul_J) receiving one constant (from among Const_1 ... Const_J). The apparatus is shown in an initial state in which the registers Reg_1 to Reg_J store $\Lambda\_1$ to $\Lambda\_J$ respectively; subsequently, at each cycle, the registers are updated. If initially a particular $\Lambda$ is zero the contents of the associated tap remain zero since multiplying by zero equals zero.

When the number of errors which occurs is less than the maximum error correction capability of the error correction code, all the coefficients of the error locator polynomial ($\Lambda(x)$) higher than j are equal to zero.

When j errors occur and j<J, natural power saving occurs; registers Reg_j+1 ... Reg_J will constantly be equal to zero and the power associated with switching of the combinatorial logic and data inputs/outputs of the flip-flops is saved. But the power associated with the register's clock input still continues to draw power unnecessarily. This wasted power can represent a major part of the power dissipated by the circuit; specifically it is most wasteful at higher clock frequencies.

As shown, the clock signal (clk) that is fed to each of the registers may be gated depending on j, per each received data block. Each register need not receive its own gated clk; the registers may be partitioned into any suitable number of groups, such as 2 or 3 or more groups, typically according to the error probability of the application at hand.

In FIG. 6A, for example, gating logic is added to generate the gated clock "clk_1" that enables "clk_1" when j (number of errors) of the received data is greater than some predefined $V_{thr}$.

The v_thr inputs to the gating logic units in FIGS. 6A and 6B indicates how many errors need to occur in order to switch on (ungate) the corresponding docks.

Pvthr is the probability that less than Vthr errors may occur, corresponding to the proportion of pages being decoded for which the associated clock will not be switched on. This in turn corresponds to the proportion of uses of the apparatus in which power is saved. It is appreciated that the total number of errors is known at the onset of decoding of each page of data.

The power saved in accordance with the above-described scheme can be computed, assuming, say, that the clock scheme is subdivided into 2 clk trees. The following description uses the notation presented in the table of FIG. 7.

The power dissipated in the traditional clk scheme for a particular received data block i.e. for a particular j, can be expressed as follows.

$$jE_{tap-clk-data}+(J-j)E_{tap-clk}$$

The average power drawn in the traditional case is:

$$E_{old-total} = \sum_{V} P(j=V)(jE_{tap-clk-data} + (J-j)E_{tap-clk})$$

Simplifying, and assuming $E_{tap} \approx E_{tap-clk-data} \approx E_{tap-clk}$ which is a reasonable simplification at fast clock frequencies, yields:

$$E_{old-total}=tE_{tap}$$

The power dissipated in the clk scheme shown herein, for a particular received data block and particular j can be expressed as follows $$jE_{tap-clk-data}+(V_{thr}-j)E_{tap-clk} j \leq V_{thr}$$

$$jE_{tap-clk-data}+(J-j)E_{tap-clk} j > V_{thr}$$

Using the same simplification utilized above:

$$E_{new-total}=P_{Vthr}V_{thr}E_{tap}+(1-P_{Vthr})tE_{tap}$$

Since $P_{Vthr} \approx 1$ and $(1-P_{Vthr})$ is small:

$$E_{new-total}=V_{thr}E_{tap}$$

Finally the power was reduced by factor of $$\left(\approx \frac{V_{thr}}{J}\right).$$

Figure 8:
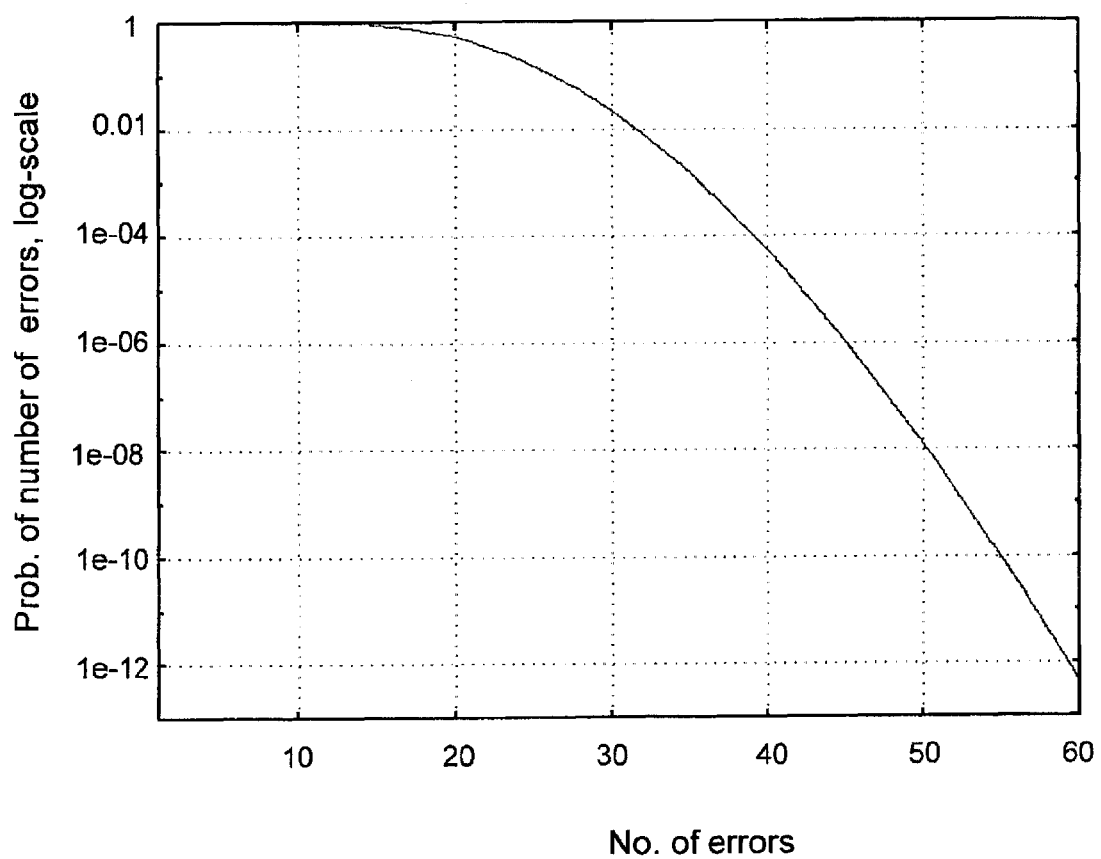
FIG. 8 is a graph showing, on a logarithmic scale, an example of probabilities of various numbers of errors per page or other block of data, which graph is useful in designing certain embodiments of the present invention.

FIG. 8 shows a graph of an example of the probability of error on logarithmic scale vs. number of errors (i.e. rank of error locator polynomial) in a particular practical application. Setting $V_{thr}=21$ yields the optimal power saving for this particular application. In this example, even if only two groups of taps (2 clock domains) are defined, it can be shown that the power is nonetheless reduced by roughly 60%.

It is appreciated that whereas the illustrated embodiment happens to include 2 clock domains, alternatively, any suitable number, n, of clock domains may be employed. The design process typically comprises the following steps:

1) Express the power of the Chien-Search as a function of the number of allowed clock-domains, e.g., using the notation of FIG. 9:

$$E_{total} = \sum_{i=0}^{l_1-1} P_i l_1 E(i, l_1) + \sum_{i=l_1}^{l_2-1} P_i l_2 E(i, l_2) + \ldots + \sum_{i=l_{n-1}}^{l_n-1} P_i l_n E(i, l_n)$$

2) Minimize the expression to find an optimal set of taps to connect to each of the clocks, or otherwise partition the taps into clock domains so as to reduce the power.

Minimization of the above expression ($E_{total}$) for $l_1, l_2, \ldots l_n$, where $l_1, l_2, \ldots l_n$ denotes the clk-gating partition scheme, yields optimal power, however the present invention is not limited to those applications in which optimal (minimal) power is achieved.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM 1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly with the ECC component.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

We claim:

1. A Chien search apparatus operative to evaluate an error locator polynomial having a known rank and including a sequence of terms for each element in a finite field whose elements correspond respectively to bits in each of a stream of data blocks to be decoded, the apparatus comprising:
   a sequence of functional units each operative to compute a corresponding term in said sequence of terms included in the error locator polynomial, each term having a degree; and
   a power saving unit operative to de-activate at least one individual functional unit from among said sequence of functional units, said individual functional unit being operative, when active, to compute a term whose degree exceeds said rank;
   wherein said power saving unit comprises multiple power saving logics, each power saving logic is arranged to selectively deactivate an individual subset of said functional units if all functional units in said individual subset are operative to compute terms whose degree exceeds said rank;
   wherein each subset of said functional units comprises functional units that are arranged to compute terms having degrees that form a continuous sequence of degrees.

2. The apparatus according to claim 1 wherein each power saving logic comprises a clock gating unit controlling a provision of a clock signal to an individual subset of said functional units that is associated with the power saving logic.

3. The apparatus according to claim 2 wherein said clock gating unit defines a plurality of clock domains, wherein each of said sequence of functional units belongs to at least one of said clock domains.

4. The apparatus according to claim 1 further comprising a single adder that is coupled to each functional unit of the sequence of functional units; wherein the single adder and the sequence of functional units are arranged to calculate a single value of an error locator polynomial.

5. The apparatus according to claim 1 wherein the multiple power saving logics consists of two power saving logics.

6. The apparatus according to claim 1 wherein the multiple power saving logics consists of three power saving logics.

7. The apparatus according to claim 1 wherein said data blocks are BCH-encoded.

8. The apparatus according to claim 1 wherein said data blocks are Reed-Solomon-encoded.

9. The apparatus according to claim 1 wherein said data blocks are stored in a flash memory device.

10. The apparatus according to claim 1 and also comprising an error locator polynomial generator operative to generate said error locator polynomial and output its rank to said power saving unit.

11. The apparatus according to claim 1, wherein different subsets of functional units comprise different numbers of functional units.

12. The apparatus according to claim 1, wherein the sequence of functional units comprises fifty nine functional units;
   wherein the multiple power saving logics comprise a first power saving logic and a second power saving logic;
   wherein the first power saving logic controls the first subset of functional units that comprises a first till nineteenth functional units arranged to compute terms of first till nineteenth degrees; and
   wherein the second power saving logic controls the second subset of functional units that comprises a twentieth first fifty ninth functional units arranged to compute terms of twentieth first till fifty ninth degrees.

13. The apparatus according to claim 1, wherein the sequence of functional units comprises fifty nine functional units;

wherein the multiple power saving logics comprise a first power saving logic, a second power saving logic and a third power saving logic;

wherein the first power saving logic controls the first subset of functional units that comprises a first till tenth functional units arranged to compute terms of first till tenth degrees; and wherein the second power saving logic controls the second subset of functional units that comprises an eleventh till twentieth functional units arranged to compute terms of eleventh till twentieth degrees;

wherein the third power saving logic controls the third subset of functional units that comprises a twenty first till fifty ninth functional units arranged to compute terms of twenty first till fifty ninth degrees.

14. A Chien search method operative to evaluate an error locator polynomial having a known rank and including a sequence of terms for each element in a finite field whose elements correspond respectively to bits in each of a stream of data blocks to be decoded, the method comprising: providing a sequence of functional units each operative to compute a corresponding term in the error locator polynomial, each term having a degree; and de-activating an individual subset of said functional units, by a power saving logic associated with the individual subset, if all functional units in said individual subset are operative to compute terms whose degree exceeds said rank; wherein each subset of said functional units comprises functional units that are arranged to compute terms having degrees that form a continuous sequence of degrees; wherein the sequence of functional units comprises multiple subsets of said functional unit and each subset of said functional units is associated with a single power saving logic.

15. The method according to claim 14 wherein a histogram of the number of errors per data block in said stream is known, said method also comprising designing power saving logic operative to effect said de-activating, including selecting, for each predetermined subset, a cut-off point in said sequence of functional units above which all functional units belong to said predetermined subset, wherein said cut-off point is selected to maximize power saving achieved by said de-activating, given said histogram.

16. The method according to claim 14, wherein different subsets of functional units comprise different numbers of functional units.

17. The method according to claim 14, wherein the sequence of functional units comprises fifty nine functional units;

wherein the multiple power saving logics comprise a first power saving logic and a second power saving logic;

wherein the first power saving logic controls the first subset of functional units that comprises a first till nineteenth functional units arranged to compute terms of first till nineteenth degrees; and wherein the second power saving logic controls the second subset of functional units that comprises a twentieth first fifty ninth functional units arranged to compute terms of twentieth first till fifty ninth degrees.

18. The method according to claim 14, wherein the sequence of functional units comprises fifty nine functional units;

wherein the multiple power saving logics comprise a first power saving logic, a second power saving logic and a third power saving logic;

wherein the first power saving logic controls the first subset of functional units that comprises a first till tenth functional units arranged to compute terms of first till tenth degrees; and wherein the second power saving logic controls the second subset of functional units that comprises an eleventh till twentieth functional units arranged to compute terms of eleventh till twentieth degrees;

wherein the third power saving logic controls the third subset of functional units that comprises a twenty first till fifty ninth functional units arranged to compute terms of twenty first till fifty ninth degrees.

* * * * *